（12） United States Patent
Chen et al.

(10) Patent No.: US 9,508,545 B2
(45) Date of Patent: Nov. 29, 2016

(54) SELECTIVELY LATERAL GROWTH OF SILICON OXIDE THIN FILM

(71) Applicant: Applied Materials, Inc., Santa Clara, CA (US)

(72) Inventors: Yihong Chen, San Jose, CA (US); Kelvin Chan, San Ramon, CA (US); Shaunak Mukherjee, Santa Clara, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/984,599

(22) Filed: Dec. 30, 2015

(65) Prior Publication Data

US 2016/0233084 A1 Aug. 11, 2016

Related U.S. Application Data

(60) Provisional application No. 62/113,944, filed on Feb. 9, 2015.

(51) Int. Cl.
*H01L 21/02* (2006.01)
*H01L 23/532* (2006.01)
*H01L 21/768* (2006.01)

(52) U.S. Cl.
CPC ... *H01L 21/02164* (2013.01); *H01L 21/02214* (2013.01); *H01L 21/02307* (2013.01); *H01L 21/02315* (2013.01); *H01L 21/76831* (2013.01); *H01L 21/76834* (2013.01); *H01L 23/53228* (2013.01)

(58) Field of Classification Search
None
See application file for complete search history.

(56) References Cited

U.S. PATENT DOCUMENTS

| 5,314,724 A * | 5/1994 | Tsukune | H01L 21/02126 257/E21.26 |
| 7,470,635 B2 * | 12/2008 | Li | H01L 21/02145 257/E21.26 |
| 7,773,648 B2 | 8/2010 | Tachibana et al. | |
| 8,053,335 B2 | 11/2011 | Yonehara | |
| 9,245,739 B2 * | 1/2016 | Ndiege | H01L 21/02164 |
| 2006/0046518 A1 * | 3/2006 | Hill | C23C 16/403 438/778 |

(Continued)

FOREIGN PATENT DOCUMENTS

| JE | 101361454 B1 | 2/2014 |
| JP | 2002237648 A | 8/2002 |

(Continued)

OTHER PUBLICATIONS

International Search Report and Written Opinion for International Application No. PCT/US2016/012146 dated Apr. 27, 2016.

*Primary Examiner* — Alexander Ghyka
(74) *Attorney, Agent, or Firm* — Patterson & Sheridan, LLP (57) ABSTRACT

Implementations disclosed herein generally relate to methods of forming silicon oxide films. The methods can include performing silylation on the surface of the substrate having terminal hydroxyl groups. The hydroxyl groups on the surface of the substrate are then regenerated using a plasma and $H_2O$ soak in order to perform an additional silylation. Further methods include catalyzing the exposed surfaces using a Lewis acid, directionally inactivating the exposed first and second surfaces and deposition of a silicon containing layer on the sidewall surfaces. Multiple plasma treatments may be performed to deposit a layer having a desired thickness.

12 Claims, 6 Drawing Sheets

(56) References Cited

U.S. PATENT DOCUMENTS

| | | | |
|---|---|---|---|
| 2006/0204651 A1* | 9/2006 | Wai | C23C 18/00 427/97.7 |
| 2009/0072317 A1* | 3/2009 | Furukawa | H01L 29/42384 257/365 |
| 2009/0104755 A1 | 4/2009 | Mallick et al. | |
| 2010/0320506 A1 | 12/2010 | Varangis et al. | |
| 2011/0014798 A1* | 1/2011 | Mallick | C23C 16/345 438/791 |
| 2012/0196451 A1* | 8/2012 | Mallick | C23C 16/401 438/787 |
| 2012/0263876 A1* | 10/2012 | Haukka | C23C 16/402 427/255.18 |
| 2012/0329230 A1 | 12/2012 | Chudzik et al. | |

FOREIGN PATENT DOCUMENTS

| | | |
|---|---|---|
| JP | 2005322900 A | 11/2005 |
| WO | 2014158462 A1 | 10/2014 |

\* cited by examiner

SELECTIVELY LATERAL GROWTH OF SILICON OXIDE THIN FILM

CROSS-REFERENCE TO RELATED APPLICATIONS

This application claims benefit of U.S. Provisional Patent Application Ser. No. 62/113,944 (APPM/22694USL), filed Feb. 9, 2015, which is herein incorporated by reference.

BACKGROUND

1. Field

Implementations described herein generally relate to semiconductor manufacturing, and, more specifically, to methods of selectively forming silicon oxide films.

2. Description of the Related Art

As the semiconductor industry introduces new generations of integrated circuits (IC's) having higher performance and greater functionality, the density of the elements that form those IC's is increased. With increased element density, the dimensions, size and spacing between the individual components or elements is reduced. Increased resolution from patterning processes is one mechanism for reduction in size and spacing of features on an IC.

Increased resolution can be achieved by altering the intrinsic resolution of the pattern. The intrinsic resolution of a pattern is the finest spatial detail that a pattern can transfer. The intrinsic resolution is a function of factors such as the wavelength of radiation used and the size of the features in a pattern. Pattern multiplication processes, such as self-aligned double patterning (SADP) and self-aligned quadruple patterning (SAQP), can be used to increase the resulting resolution of a patterning process without changing the intrinsic resolution of exposure tools. Thus, these processes can decrease the number of lithography exposures per layer, which decreases a significant cost in device fabrication.

Current pattern multiplication is usually achieved by the combination of several deposition and etch steps. Such approach is highly cost inefficient, and may create significant integration complexity. Further, as feature sizes becomes smaller Therefore, there is a need for new methods of controlling feature size in ICs.

SUMMARY

Implementations described herein generally relate to methods of selectively depositing silicon oxide layers, such as a selective deposition on dielectric surfaces while avoiding deposition on metal surfaces. The methods generally include performing silylation on the surfaces having exposed hydroxyl groups. When a surface with OH is exposed to a silylating agent, the agent reacts with OH to form a covalent linkage to a —O—$Si(CH_3)_3$ group. The hydroxyl groups on the surface of the substrate are then regenerated using a nitrogen-containing plasma and an $H_2O$ soak in order to convert the —O—$Si(CH_3)_3$ group to a Si—OH group and to perform additional silylations. Multiple silylations, plasma treatments, and soaks may be performed to deposit a layer having a desired thickness.

In one implementation, a method of depositing a silicon oxide film can include positioning a substrate in a process chamber, the substrate having: a first layer; and a second layer disposed over the first layer, the second layer having an exposed second surface and one or more features formed therein, the features creating one or more sidewall surfaces and an exposed first surface; treating the substrate with a catalyst, the catalyst comprising a Lewis acid, the catalyst forming terminal reactive groups on the exposed first surface, the one or more sidewall surfaces and the exposed second surface; delivering a catalyst deactivator to the substrate, the catalyst deactivator being activated by a plasma, the substrate being biased such that the catalyst deactivator is received by the exposed first surface and the exposed second surface, the terminal reactive groups being maintained on the one or more sidewall surfaces; and delivering a silanol to the substrate, the silanol depositing a silicon-containing layer on the one or more sidewall surfaces.

In another implementation, a method of depositing a silicon oxide film can include positioning a substrate in a process chamber, the substrate comprising a dielectric region having an exposed dielectric surface and one or more features formed therein, the features having sidewalls, the exposed dielectric surface and the sidewalls having terminal hydroxyl groups; and a metal region, the metal region having an exposed surface which is substantially oxygen free; and performing one or more silylation cycles to deposit a silicon and carbon containing layer selectively on the sidewalls and the exposed dielectric surface, each of the silylation cycles comprising performing a silylation on the surface of the substrate, the silylation depositing a silicon and carbon containing layer; exposing the substrate to a nitrogen-containing plasma, the nitrogen-containing plasma displacing at least one carbon with a nitrogen in the silicon and carbon containing layer; and exposing the substrate to a water-containing gas to form hydroxyl groups on the surface of the substrate.

In another implementation, a method of depositing a silicon oxide film can include positioning a substrate in a process chamber, the substrate having: a metal layer comprising copper; and a dielectric layer disposed over the metal layer, the dielectric layer having an exposed dielectric surface and one or more features formed therein, the features creating one or more sidewall surfaces and an exposed metal surface; treating the substrate with a catalyst, the catalyst comprising a tetramethyl aluminum, the catalyst forming a terminal $CH_3$ group on the exposed metal surface, the one or more sidewall surfaces and the exposed dielectric surface; forming a capacitively coupled plasma comprising a catalyst deactivator; delivering the capacitively coupled plasma to the substrate, the substrate being biased such that the catalyst deactivator is received by the exposed metal surface and the exposed dielectric surface, the terminal $CH_3$ groups being maintained on the one or more sidewall surfaces; and delivering a silanol to the substrate, the silanol depositing a silicon oxide layer on the one or more sidewall surfaces.

BRIEF DESCRIPTION OF THE DRAWINGS

So that the manner in which the above recited features of the present devices and methods can be understood in detail, a more particular description of the devices and methods, briefly summarized above, may be had by reference to implementations, some of which are illustrated in the appended drawings. It is to be noted, however, that the appended drawings illustrate only typical implementations of the devices and methods and are therefore not to be considered limiting of its scope, for the devices and methods may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein generally relate to methods of forming carbon-doped oxide films. The methods generally include generating hydroxyl groups on a surface of the substrate using a plasma, and then performing silylation on the surface of the substrate. The hydroxyl groups on the surface of the substrate are then regenerated using a plasma in order to perform an additional silylation. Multiple plasma treatments and silylations may be performed to deposit a layer having a desired thickness.

Figure 1:
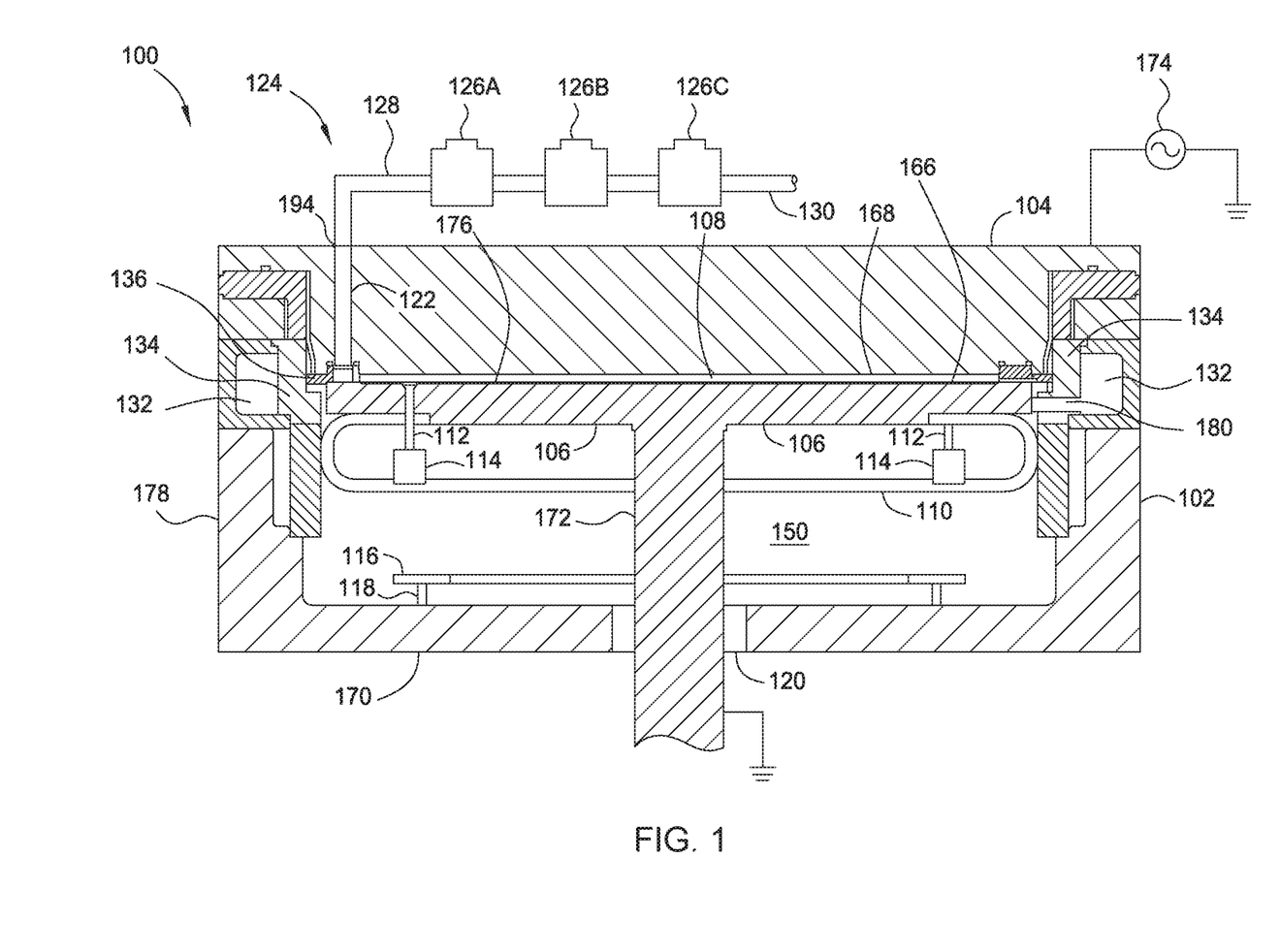
FIG. 1 is a cross-sectional view of a processing chamber adapted to practice implementations.

FIG. 1 is a cross-sectional view of a processing chamber 100 according to one implementation. The processing chamber 100 has a chamber body 102 and a chamber lid 104 that couples to the chamber body 102 to define an interior 150. A substrate support 106 is disposed in the interior 150 of the chamber 100. An upper surface 166 of the substrate support 106 and a lower surface 168 of the chamber lid 104 define a processing region 108 in which a substrate disposed in a substrate contact area 176 on the upper surface 166 of the substrate support 106 is exposed to a processing environment.

Substrates enter and exit the processing chamber 100 through a substrate passage or opening 110 in the chamber body 102. In the cross-sectional view of FIG. 1, the substrate passage or opening 110 is behind the cross-section plane, in the "back" of the chamber 100. The substrate support 106 is movable along a longitudinal axis of the chamber 100 to position the substrate support 106 alternately in a substrate handling position, with the upper surface 166 of the substrate support 106 proximate the opening 110, and a substrate processing position, with the upper surface 166 of the substrate support 106 proximate the lower surface 168 of the chamber lid 104. In the view of FIG. 1, the substrate support 106 is shown in the substrate processing position. When the substrate support 106 is located in the substrate processing position, a distance between the upper surface 166 of the substrate support 106 and the lower surface 168 of the chamber lid 104 is about 2 mm to about 8 mm. A shaft 172 of the substrate support 106 typically extends through an opening 120 in a lower wall 170 of the chamber body 102 and couples to a lift mechanism (not shown) to actuate movement of the substrate support 106.

A substrate elevator 112 is disposed through the substrate support 106. The substrate elevator 112 has a base 114 that contacts an actuator 116 disposed in a lower area of the interior 150 of the chamber 100. The actuator 116 is supported from the lower wall 170 by a support member 118. The actuator 116 may be an annular member, such as a ring, and the support member 118 may be an annular protrusion from the actuator 116. The actuator 116, the support member 118, or both may alternately be segmented. For example, either or both may be a segmented annular member, or the actuator 116 may be a pad, post, or spindle positioned to engage the base 114 of the substrate elevator 112.

The support member 118 maintains the actuator 116 in a substantially parallel relation to the upper surface 166 of the substrate support 106. When the substrate support 106 is moved from the processing position to the substrate handling position, the base 114 of the substrate elevator 112 contacts the actuator 116, causing the substrate elevator 112 to protrude through the upper surface of the substrate support 106 and lift a substrate disposed thereon above the upper surface for access by a substrate handling robot (not shown) through the opening 110. Only two substrate elevators 112 are visible in the view of FIG. 1, but a typical implementation will have three or more substrate elevators 112 distributed to provide stable stationing for substrate handling.

The chamber lid 104 may be an electrode, and may be coupled to a source of RF power 174. If the chamber lid 104 is an electrode, the chamber lid 104 will typically include a conductive material. The chamber lid 104 may be entirely or substantially made of a conductive material, or may be coated with a conductive material to any convenient degree. If the chamber lid 104 is used as an electrode, the lower surface 168 of the chamber lid 104 will be conductive to provide RF coupling into the processing region 108 proximate the upper surface 166 of the substrate support 106. In one implementation, the chamber lid 104 is aluminum. The processing chamber 100 is adapted to generate a plasma therein, such as a capacitively coupled plasma.

A gas manifold 124 is coupled to the chamber lid 104 at a port 194. Process gases are delivered to the chamber through a gas line 128. A plurality of high speed valves 126A-C control flow of gases through the gas line 128 into the chamber 100. The high speed valves may be ALD valves, and in some implementations may be capable of opening or closing in less than 1 second, and in some cases less than 0.25 seconds. A precursor line 130 is coupled to one of the high speed valves 126A-C. The other high speed valves may be used to join other precursor lines, not visible in FIG. 1, to deliver gases through the gas line 128. Operation of the high speed valves enables fast switch of gas flows as needed for chamber operations, such as ALD deposition cycles.

The chamber lid 104 has a gas inlet 122 located in a peripheral region of the chamber lid 104 and in fluid communication with the port 194 and the gas manifold 124. The gas inlet 122 may be located outside the substrate contact area 176 of the substrate support 106. An edge ring 136 is disposed around a peripheral region of the substrate support 106. The edge ring 136 may be an annular member having an inner dimension and an outer dimension. The inner dimension of the edge ring 136 may be substantially the same as a dimension of the substrate contact area 176 such that a substrate disposed on the substrate support nests inside the edge ring 136, as shown in FIG. 1. The inner dimension of the edge ring 136 may also be larger than the dimension of the substrate contact area 176. The inner dimension of the edge ring 136 may also be smaller than the substrate contact area 176 so that a portion of the edge ring 136 extends over an edge of the substrate. The edge ring 136 of FIG. 1 rests on the substrate support 106 when the substrate support 106 is in the processing position. Thus, the substrate support 106 also supports the edge ring 136 when in the processing position.

A pumping plenum 132 is located in a side wall 178 of the chamber body 102 proximate the processing position of the substrate support 106. The pumping plenum 132 is an annular passage around the processing region 108 where processing gases are evacuated from the processing region 108. A liner 134 separates the pumping plenum 132 from the processing region 108. The liner 134 has an opening 180 that allows process gases to flow from the processing region 108 into the pumping plenum 132. The opening 180 is typically located below the upper surface 166 of the substrate support 106 when the substrate support 106 is in the processing position.

Figure 2:
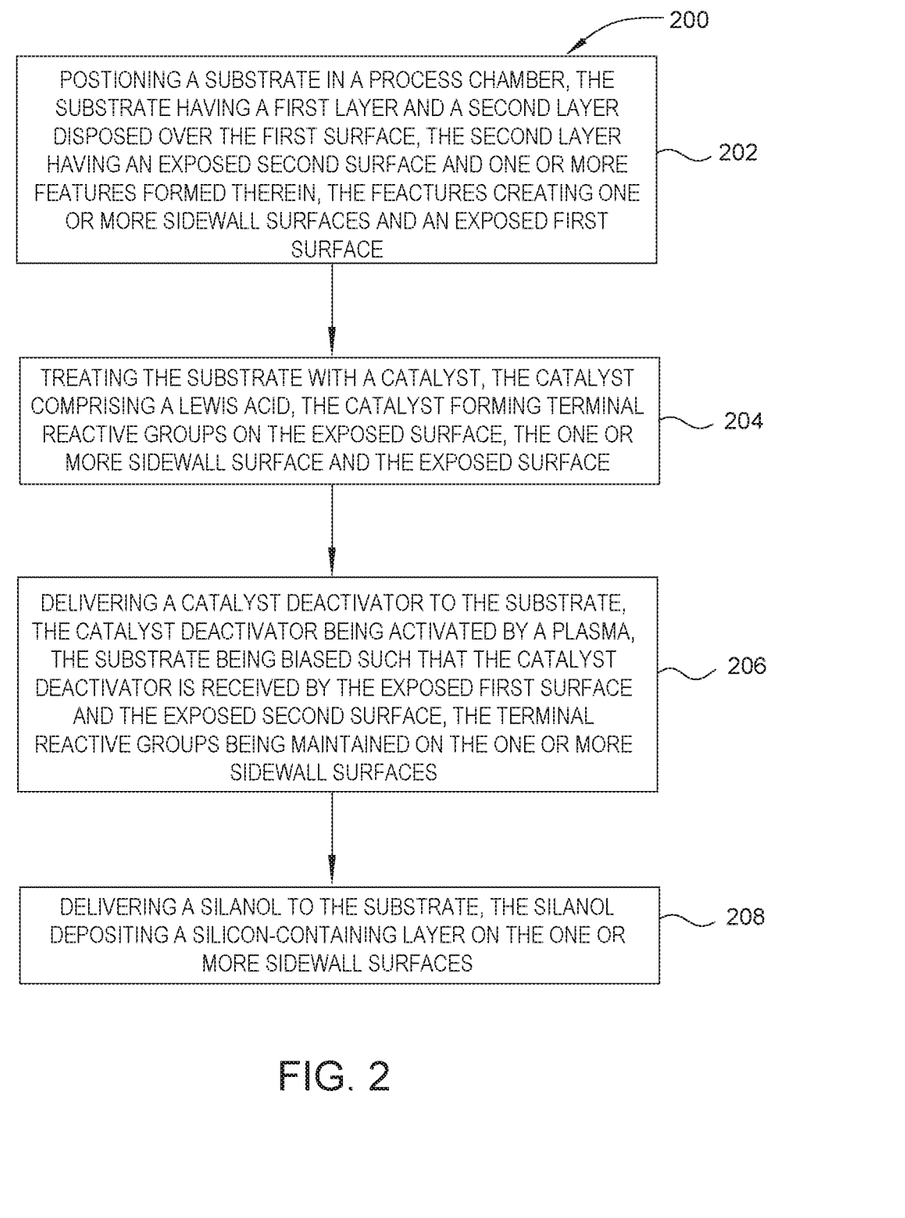
FIG. 2 is a flow diagram of method operations for depositing a silicon oxide film, according to one implementation.

FIG. 2 is a flow diagram of a method 200 for depositing a carbon-doped oxide film, according to one implementation. The method 200 includes positioning a substrate in a process chamber, the substrate having a first layer; and a second layer disposed over the first layer, the second layer having an exposed second surface and one or more features formed therein, the features creating one or more sidewall surfaces and an exposed first surface, at element 202; treating the substrate with a catalyst, the catalyst comprising a Lewis acid, the catalyst forming terminal reactive groups on the exposed first surface, the one or more sidewall surfaces and the exposed second surface, at 204; delivering a catalyst deactivator to the substrate, the catalyst deactivator being activated by a plasma, the substrate being biased such that the catalyst deactivator is received by the exposed first surface and the exposed second surface, the terminal reactive groups being maintained on the one or more sidewall surfaces, at 206; and delivering a silanol to the substrate, the silanol depositing a silicon-containing layer on the one or more sidewall surfaces, at 208. FIGS. 3A-3D illustrate a substrate during formation of a silicon oxide film, according to one implementation. To facilitate explanation of implementations disclosed herein, FIG. 2 and FIGS. 3A-3D will be explained in conjunction.

Figure 3A:
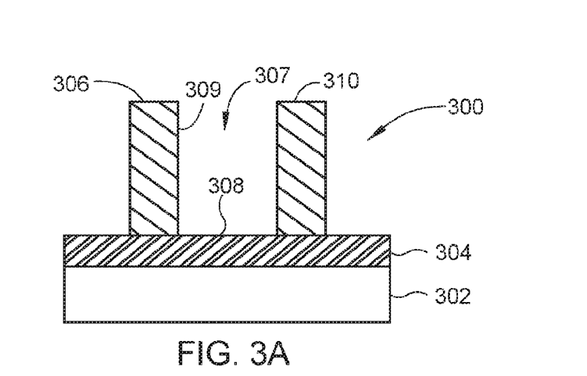
FIGS. 3A-3D illustrate a substrate during formation of a silicon oxide film, according to one implementation.

The method 200 begins by positioning a substrate in a process chamber, the substrate having a first layer; and a second layer disposed over the first layer, the second layer having an exposed second surface and one or more features formed therein, the features creating one or more sidewall surfaces and an exposed first surface, at 202. In element 202, a device 300, shown in FIG. 3A, is positioned in a processing chamber, such as processing chamber 100 shown in FIG. 1. The device 300 comprises a substrate 302. The substrate 302 may be, for example, a silicon wafer having a silicon oxide layer or carbon-doped silicon oxide layer thereon. The substrate 302, as illustrated, includes a first layer 304. The first layer 304 can be a metal layer, such as a layer containing copper. A second layer 306 can be formed above the first layer 304. The second layer 306 can be a dielectric layer, such as a silicon oxide layer. As shown, the second layer 306 has an exposed second surface 310 and one or more features 307 formed therein. The one or more features 307 have a sidewall surface 309 and extend down to an exposed first surface 308.

Figure 3B:
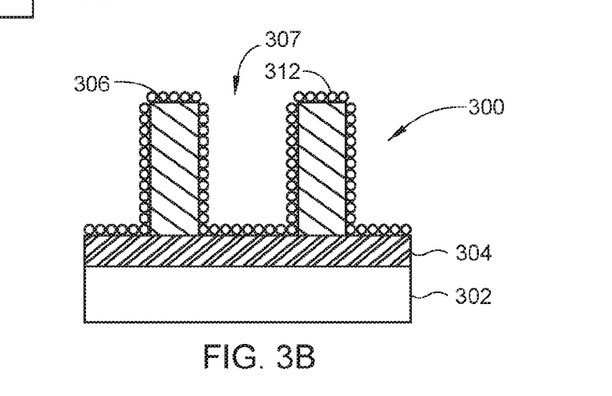
Figure 3C:
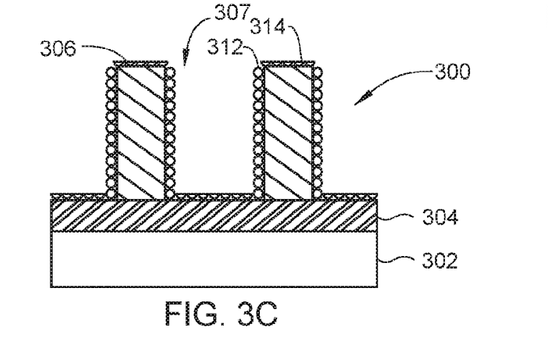

Positioned in the process chamber, the substrate is treated with a catalyst, the catalyst comprising a Lewis acid, at 204. The Lewis acid can be an organo compound, such as an organoaluminum compound, an organoiron compound, an organotitanium compound, an organozinc compound, or combinations thereof. In one implementation, the Lewis acid is either trimethylaluminum (TMA), tetramethyl titanium, tetramethyl zinc or combinations thereof. The Lewis acid can further be a halogen containing compound, such as $AlCl_3$, $FeCl_3$, $TiCl_4$, $ZnCl_4$ or combinations thereof. The Lewis acid reacts with the exposed surfaces, such as the exposed first surface 308, the one or more sidewall surfaces 309 and the exposed second surface 310, creating a layer 312 having terminal reactive groups, as shown in FIG. 3B. Using the above Lewis acids, the terminal reactive groups of the layer 312 can be organic groups, such as a methyl group, or halogen groups, such as chlorine groups.

A catalyst deactivator can then be delivered to the substrate, the catalyst deactivator being activated by a plasma, at 206. The catalyst deactivator can be a gas such as $O_2$, $N_2$, $NH_3$, $H_2$, $H_2O$, He, Ar, or combinations thereof. The plasma can be a capacitively coupled plasma. The plasma should have an energy level such that the catalyst deactivator is primarily ionized without creating radicals. After the layer 312 is exposed to the catalyst deactivator and assuming one of the specifically named Lewis Acids above, the —CH3 or —Cl bond is broken and a non-reactive species is substituted, shown as layer 314 of FIG. 3C. For example, when the catalyst deactivator is $O_2$ or $H_2O$, the terminal reactive group is substituted with an —OH group. The substrate is biased such that the catalyst deactivator is received by the exposed first surface 308 and the exposed second surface 310, without being received by the sidewall surfaces 309. Thus, the terminal reactive groups are maintained on the sidewall surfaces 309.

Once the exposed first surface 308 and the exposed second surface 310 are treated with the catalyst deactivator, a silanol is delivered to the substrate, the silanol depositing a silicon-containing layer 316 on the one or more sidewall surfaces, at 208. The silanol can be any compound having the general formula $Si(OR)_3OH$, where the R group being a hydrocarbon. In one example, the silanol is tris-(tert-butoxy)silanol, tris-(tert-pentoxy)silanol, or derivatives thereof. The silanol is delivered to the surface of the device 300, where it reacts with the remaining terminal reactive groups of the layer 312 as formed on the sidewall surfaces 309, shown in FIG. 3D.

Figure 3D:
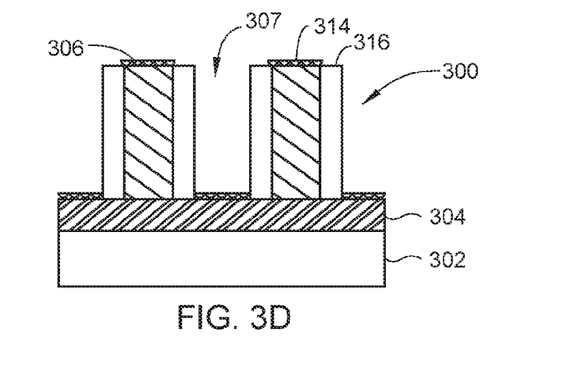

Depending on the exposure time and concentration, the growth thickness can be up to about 200 Å on the sidewall surfaces 309. By repeating elements 204, 206 and 208, is it possible to grow films thicker than 200 Å. Advantageously, the growth thickness on surfaces with deactivated catalyst (e.g., the exposed first surface 308 and the exposed second surface 310) is not measurable. Thus, selective growth can be achieved on the sidewall surfaces 309 without detectable growth on the exposed first surface 308 or the exposed second surface 310. This selective growth allows for the creation of smaller features useful for continued miniaturization of IC devices.

Figure 4:
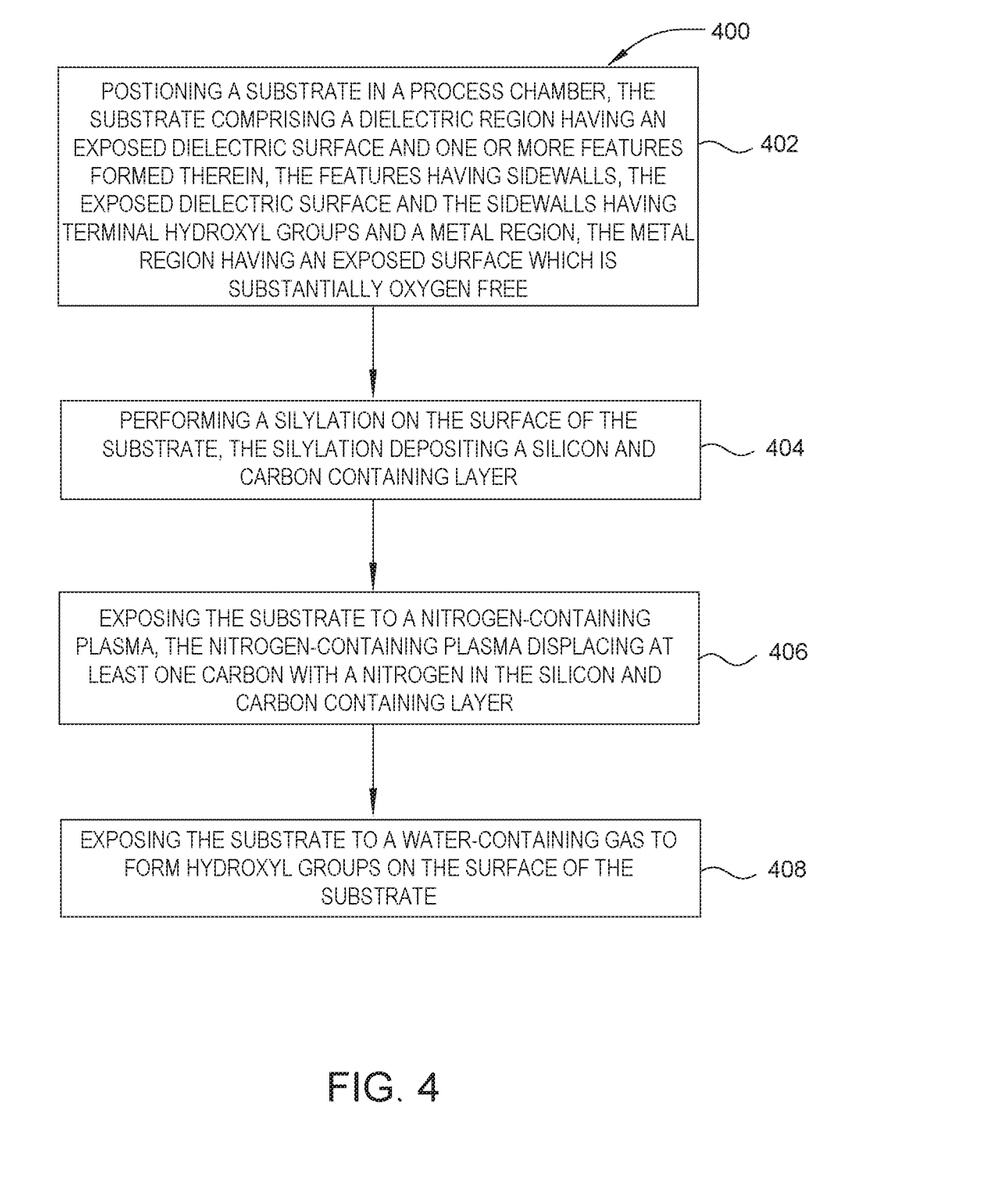
FIG. 4 is a flow diagram of method operations for depositing a silicon carboxide film, according to one implementation.

FIG. 4 is a flow diagram of method 400 for depositing a silicon carboxide film, according to one implementation. The method 400 includes positioning a substrate in a process chamber, the substrate comprising a dielectric region having an exposed dielectric surface and one or more features formed therein, the features having sidewalls, the exposed dielectric surface and the sidewalls having terminal OH groups; and a metal region, the metal region having an exposed surface which is substantially oxygen free, at 402; and performing one or more silylation cycles to deposit a silicon and carbon containing layer selectively on the sidewalls and the exposed dielectric surface, each of the silylation cycles comprising: performing a silylation on the surface of the substrate, the silylation depositing a silicon and carbon containing layer, at 404; exposing the substrate to a nitrogen-containing plasma, the nitrogen-containing plasma displacing at least one carbon with a nitrogen in the silicon and carbon containing layer, at 406; and exposing the substrate to a water-containing gas to form hydroxyl groups on the surface of the substrate, at 408. FIGS. 5A-5E illustrate a substrate during formation of a silicon carboxide, according to one implementation. To facilitate explanation of implementations disclosed herein, FIG. 4 and FIGS. 5A-5E will be explained in conjunction.

Figures 5A, 5B:
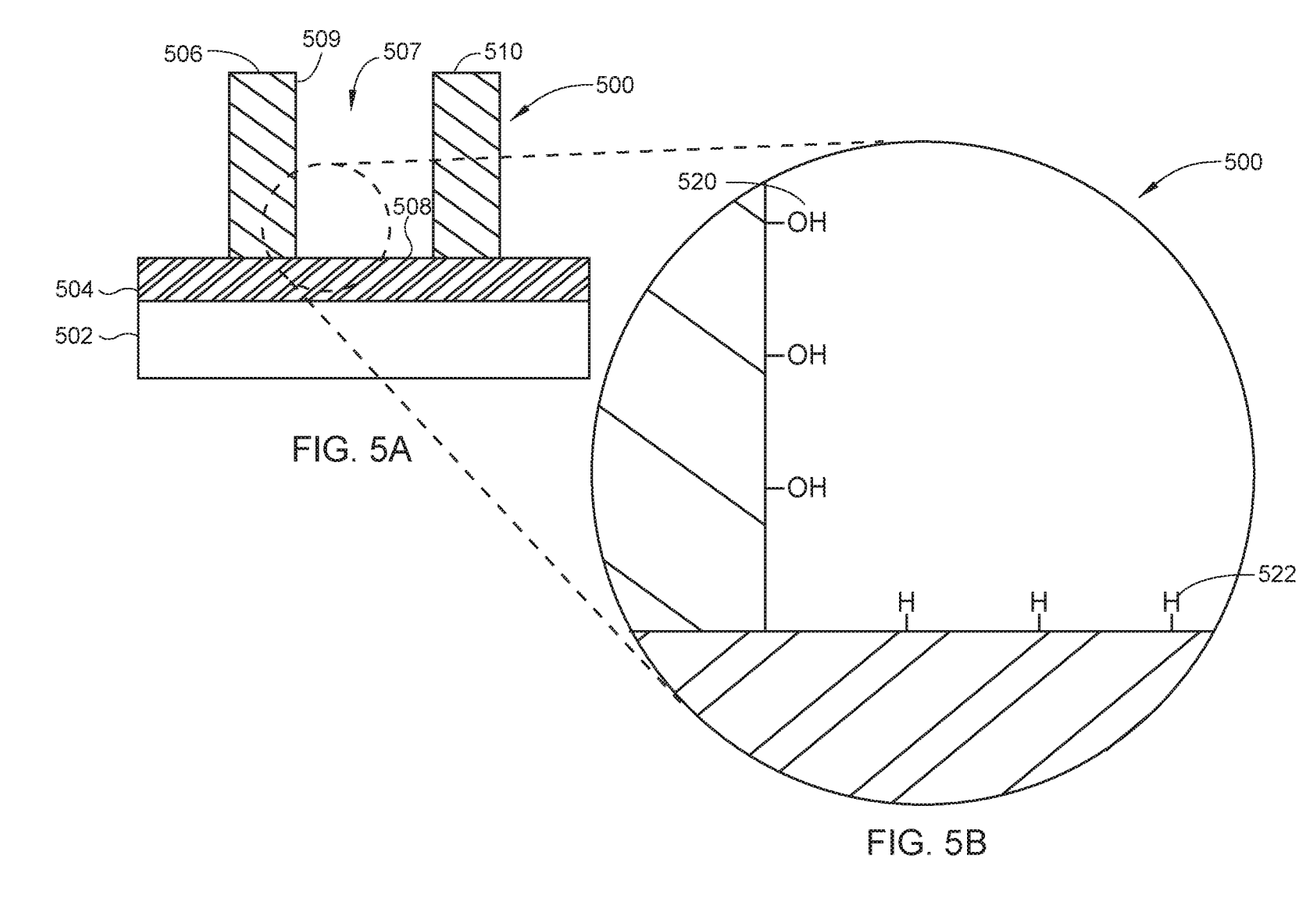
FIGS. 5A-5E illustrate a substrate during formation of a silicon carboxide film, according to another implementation.

The method 400 begins by positioning a substrate in a process chamber, the substrate comprising a dielectric region having an exposed dielectric surface and one or more features formed therein, the features having sidewalls, the exposed dielectric surface and the sidewalls having terminal OH groups; and a metal region, the metal region having an exposed first surface 508 which is substantially oxygen free, at 402. In element 402, a device 500, shown in FIG. 5A, is positioned in a processing chamber, such as processing chamber 100 shown in FIG. 1. The device 500 comprises a substrate 502. The substrate 502 may be, for example, a silicon wafer having a silicon oxide layer or carbon-doped silicon oxide layer thereon. The substrate 502, as illustrated, includes a first layer 504. The first layer 504 can be a metal layer, such as a layer containing copper. A second layer 506 can be formed above the first layer 504. The second layer 506 can be a dielectric layer, such as a silicon oxide layer. As shown, the second layer 506 has an exposed second surface 510 and one or more features 507 formed therein. The one or more features 507 have a sidewall surface 509 and extend down to an exposed first surface 508. The exposed first surface 508 has a terminal non-reactive species 522, shown here as a hydrogen. The exposed second surface 510 and the sidewall surface 509 have terminal hydroxyl groups 520.

Figures 5C, 5D, 5E:
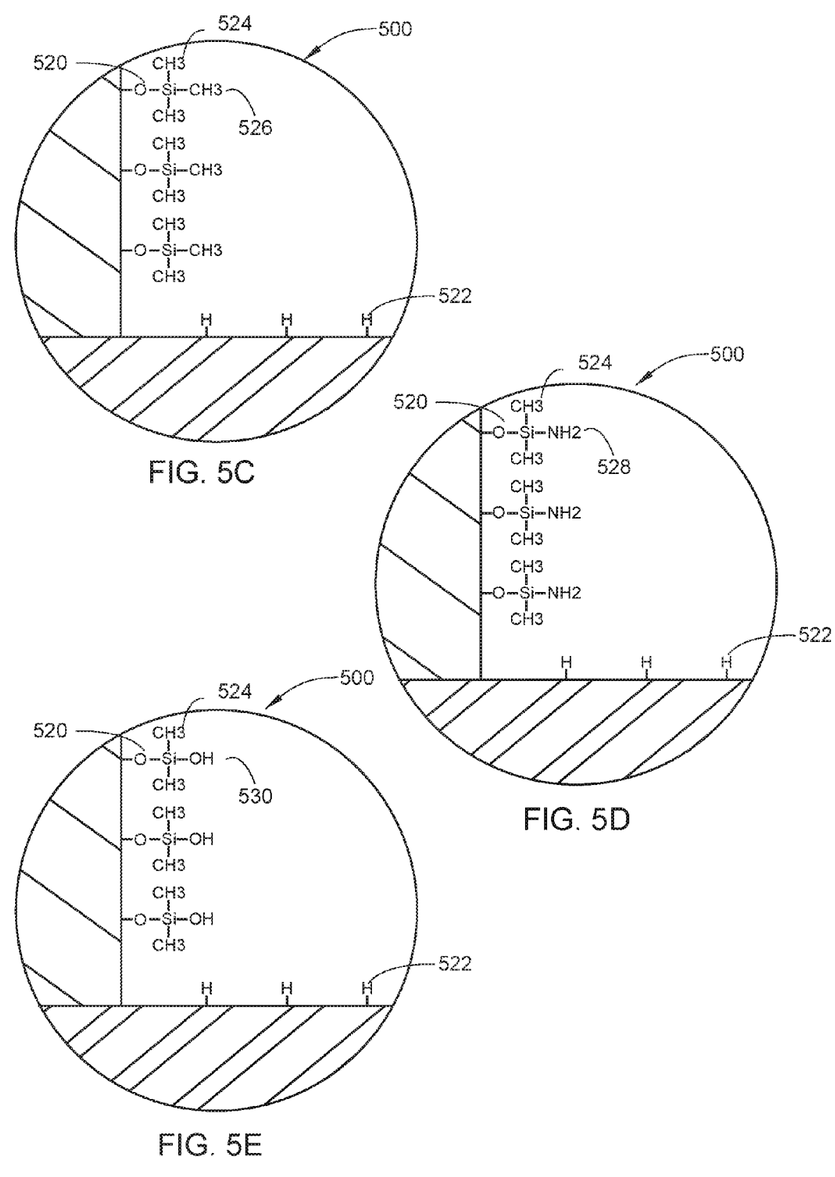

With the substrate positioned, a silylation is performed on the surface of the substrate, the silylation depositing a silicon and carbon containing layer, at 404. A silylation reaction is performed by exposing the device 300 to a silylating agent, such as (dimethylamino)trimethylsilane (DMATMS), bis(dimethylamino) dimethylsilane or combinations thereof. The silylation results in the substitution of a hydrogen from the hydroxyl group 520 with a trimethylsilyl pendant group 524, as illustrated in FIG. 5C. The silylation reaction adds a monolayer of trimethylsilyl groups to the sidewall surfaces 509 and the exposed second surface 510 of the device 500. The reaction results in the formation of a silicon oxide layer having some carbon incorporated therein due to the presence of the methyl groups of the trimethylsilane, and thus, a silicon carboxide layer is formed. Using the silylation reaction described above, discrete monolayers of silicon carboxide can be formed, allowing for the reproducible deposition of relatively thin layers on a substrate.

In one example, the substrate is maintained at a temperature within a range of about 25 degrees Celsius to about 400 degrees Celsius, such as about 75 degrees Celsius. The pressure is maintained within a range of about 100 m Torr to about 760 Torr, such as 6 Torr. The silylating agent is carried by an inert gas provided at a flow rate of about 0.1 to about 4.0 standard liters/min (slm), such as about 2 slm. The inert gas may be one or more of helium, argon, or diatomic nitrogen. The silylating agent is provided at a rate of about 0.1 gram/min to about 4.0 gram/min. The substrate may be exposed to the silylating agent for about 5 to about 300 seconds, such as about 60 seconds.

It is to be noted that silylation reaction consumes the hydroxyl groups present in the second layer 506, in implementations such as the dielectric layer, and thus, eventually, further silylation does not occur. To facilitate further silylation, thus increasing the thickness of the film formed on the substrate 502, the second layer 506 is treated to induce the formation of additional hydroxyl groups thereon (e.g., regenerated).

Once the silylation reaction is complete, the substrate is exposed to a nitrogen-containing plasma, the nitrogen-containing plasma displacing at least one carbon with a nitrogen in the silicon and carbon containing layer, at 406. The plasma treatment includes exposing the substrate 330 to a nitrogen-containing plasma, such as a plasma formed from ammonia. The plasma treatment facilitates the formation of hydroxyl groups by breaking some of the silicon-methyl bonds, displacing the terminal methyl group 526 with an amine group 528 as shown in FIG. 5D.

In one example, $NH_3$ gas may be provided to the chamber at a flow rate between about 100 sccm and about 5000 sccm, such as about 150 sccm, and applying 50 watts RF power to generate a plasma. In another example, RF power may be between about 10 Watts and about 1000 Watts, such as 60 Watts. The substrate may be maintained at a temperature of about 200 degrees Celsius, and the chamber pressure may be about 3 Torr. An inert gas, such as $N_2$, may be provided to the chamber at a flow rate of about 100 to about 30000 sccm, such as 27000 sccm. The substrate may be maintained at a temperature of about 25-400 degrees Celsius, such as about 200 degrees. The pressure may be maintained within a range of about 1 Torr to about 10 Torr, such as 4.2 Torr. The exposure time may be within a range of about 1 second to about 60 seconds, such as 4-10 seconds.

Next, the substrate is exposed to a water-containing gas to form hydroxyl groups on the surface of the substrate, at 408. The substrate 502 is exposed to a water-containing gas to facilitate formation of hydroxyl groups 530 by displacing the amine groups 528 in the pendant group 524, as shown in FIG. 5E. The water-containing gas may include steam or water vapor produced using a water vapor generator (WVG). In one example, the flow rate of the water vapor gas may be about 1 sccm to about 1000 sccm, such as about 10 sccm.

Undesirable water molecules, which may present on the surface of the substrate 302 after element 408, are desorbed and debonded by reducing the pressure within the processing chamber and/or by increasing the temperature within the process chamber. The volatile components may then be exhausted from the processing chamber.

Benefits of the implementations generally include the reproducible and selective deposition of silicon oxide films having relatively small thicknesses, such as less than about 100 angstroms or less than about 10 angstroms. The silicon oxide layers can be deposited via Lewis acid catalyzed silanol deposition. Selectivity can be controlled by biased inactivation of selected surfaces. In further implementations, the silicon oxide layers can be deposited via silylation by regenerating the surface of the substrate with a plasma and water treatment. Silylation allows for accurate layer-by-layer deposition, thus facilitating the formation of very thin layers having exact thicknesses.

While the foregoing is directed to implementations of the application, other and further implementations may be devised without departing from the basic scope thereof, and the scope thereof is determined by the claims that follow.

We claim:

1. A method of depositing a silicon oxide film, sequentially comprising:
  positioning a substrate in a process chamber, the substrate having:
  a first layer; and
  a second layer disposed over the first layer, the second layer having an exposed second surface and one or more features formed therein, the features creating one or more sidewall surfaces and an exposed first surface;

treating the substrate with a catalyst, the catalyst comprising a Lewis acid, the catalyst forming terminal reactive groups on the exposed first surface, the one or more sidewall surfaces and the exposed second surface;

delivering a catalyst deactivator to the substrate, the catalyst deactivator being activated by a plasma, the substrate being biased such that the catalyst deactivator is received by the exposed first surface and the exposed second surface, the terminal reactive groups being maintained on the one or more sidewall surfaces; and delivering a silanol to the substrate, the silanol depositing a silicon-containing layer on the one or more sidewall surfaces.

2. The method of claim 1, wherein the terminal reactive group is CH3.

3. The method of claim 1, wherein the silanol is a compound having the general formula Si(OR)3OH, the R group being a hydrocarbon.

4. The method of claim 1, wherein the silanol is tris-(tert-butoxy)silanol, tris-(tert-pentoxy)silanol, or derivatives thereof.

5. The method of claim 1, wherein the Lewis acid is an organoaluminum compound, an organoiron compound, an organotitanium compound, an organozinc compound, or combinations thereof.

6. The method of claim 1, wherein the Lewis acid is trimethylaluminum (TMA).

7. The method of claim 1, wherein the Lewis acid is AlCl3, FeCl3, TiCl4, ZnCl4 or combinations thereof.

8. The method of claim 1, wherein the catalyst deactivator comprises O2, N2, NH3, H2, H2O, He, Ar, or combinations thereof.

9. The method of claim 1, wherein the treating the substrate with the catalyst, the delivering of the catalyst deactivator to the substrate and the delivering of the silanol to the substrate are sequentially repeated one or more times.

10. A method of depositing a silicon oxide film, sequentially comprising:

positioning a substrate in a process chamber, the substrate having:

a metal layer comprising copper; and a dielectric layer disposed over the metal layer, the dielectric layer having an exposed dielectric surface and one or more features formed therein, the features creating one or more sidewall surfaces and an exposed metal surface;

treating the substrate with a catalyst, the catalyst comprising a tetramethyl aluminum, the catalyst forming a terminal CH3 group on the exposed metal surface, the one or more sidewall surfaces and the exposed dielectric surface;

forming a capacitively coupled plasma comprising a catalyst deactivator;

delivering the capacitively coupled plasma to the substrate, the substrate being biased such that the catalyst deactivator is received by the exposed metal surface and the exposed dielectric surface, the terminal CH3 groups being maintained on the one or more sidewall surfaces; and delivering a silanol to the substrate, the silanol depositing a silicon oxide layer on the one or more sidewall surfaces.

11. The method of claim 10, wherein the silanol is tris-(tert-butoxy)silanol, tris-(tert-pentoxy)silanol, or derivatives thereof.

12. The method of claim 11, wherein the catalyst deactivator comprises O2, N2, NH3, H2, H2O, He, Ar, or combinations thereof.

* * * * *